United States Patent
Ryo

(10) Patent No.: US 6,720,248 B2
(45) Date of Patent: Apr. 13, 2004

(54) METHOD OF FORMING METAL INTERCONNECTION LAYER IN SEMICONDUCTOR DEVICE

(75) Inventor: Sung Gyu Ryo, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/325,845

(22) Filed: Dec. 23, 2002

(65) Prior Publication Data

US 2003/0186524 A1 Oct. 2, 2003

(30) Foreign Application Priority Data

Apr. 1, 2002 (KR) ................. 10-002002-17701

(51) Int. Cl.⁷ .......................................... H01L 21/4763
(52) U.S. Cl. ...................... 438/622; 438/638; 438/660; 438/687; 438/643
(58) Field of Search ................................ 438/622, 638, 438/642, 643, 646, 660, 662, 687

(56) References Cited

U.S. PATENT DOCUMENTS

| 6,130,102 A | 10/2000 | White, Jr. et al. |
| 6,211,034 B1 | 4/2001 | Visokay et al. |
| 6,274,424 B1 | 8/2001 | White, Jr. et al. |
| 6,420,189 B1 * | 7/2002 | Lopatin ........................ 438/2 |
| 6,436,723 B1 | 8/2002 | Tomita et al. |
| 2002/0142590 A1 * | 10/2002 | Pan et al. .................... 438/687 |
| 2003/0087522 A1 * | 5/2003 | Ngo et al. .................... 438/660 |
| 2003/0143839 A1 * | 7/2003 | Raaijmakers et al. ....... 438/633 |
| 2003/0160326 A1 * | 8/2003 | Uzoh et al. .................. 257/758 |

* cited by examiner

*Primary Examiner*—Tuan H. Nguyen
(74) *Attorney, Agent, or Firm*—Morgan, Lewis & Bockius LLP

(57) ABSTRACT

The present invention relates to a method of forming a metal interconnection layer in a semiconductor device by which a dual damascene pattern, a via hole or a trench having a high aspect ratio is consecutively filled with a metal film without void by means of an electroplating method. For this, the method comprises the steps of forming a lower conductive layer on a semiconductor substrate, forming an interlayer insulating film on the semiconductor substrate on which the lower conductive layer is formed, selectively etching the interlayer insulating film to form an opening of a given shape through which the lower conductive layer is exposed, forming a metal seed layer along the step on the result in which the opening of the given shape is formed, reflowing the metal seed layer by means of a laser process to form the metal seed layer of an uniform thickness, performing a hydrogen reduction annealing process for the metal seed layer, and forming a metal film on the metal seed layer by means of an electroplating method.

14 Claims, 4 Drawing Sheets

METHOD OF FORMING METAL INTERCONNECTION LAYER IN SEMICONDUCTOR DEVICE

BACKGROUND OF THE INVENTION

1. Field of the Invention

The invention relates generally to a method of forming a metal interconnection layer in a semiconductor device. More particularly, the invention relates to a method of forming a metal interconnection layer in a semiconductor device by which a metal seed layer is processed by a laser and a metal film is formed using an electroplating method.

2. Description of the Prior Art

A plating method includes an electroless plating method and an electroplating method. The electroless plating method has advantages that it can obtain a good gap filling characteristic and a high-speed growth even in a line structure having a high aspect ratio. However, this method has disadvantages that tolerance against the electro migration (hereinafter call EM) is low since the grain size is small and the process is also difficult to control due to complicated chemical reaction. On the other had, the electroplating method had advantages that the growth speed is faster, chemical reaction is relatively simple, it is easy to handle, the grain size is large, a good film quality can be obtained and tolerance against EM is thus good. However, the electroplating method has an disadvantage that it necessarily requires a seed layer.

The electroplating method is one by which a membrane of other metal is formed in metal or nonmetal devices using an electric energy. Electrolysis means that physical or chemical change is caused by the electric energy from the outside. Upon electrolysis, the electrolytic cell includes two electrodes of anode and cathode, and an electrolyte existing between the two electrodes. In other words, electroplating of metal is performed with the surface of the conductive material contained in a solution where plated metal is melt. The surface of the conductive material is electrically connected to an external power supply. Current thus flows into the solution through the surface of the conductive material. If so, metal ions react with electrons to form a metal. Deposition is performed based on this principle.

However, in the process of forming the cupper line using the above electroplating method, it is necessarily required that the seed layer be uniformly deposited. A method of depositing the seed layer, which has been recently used, employs a physical vapor deposition method. In the method of forming the copper line using this method, a copper anti-diffusion barrier layer and a copper seed layer are formed by means of the physical vapor deposition method. A copper film is then formed on them by means of the electroplating method, thus burying a via or a trench. The method of forming the copper line is finished by means of a chemical mechanical polishing process. However, the process for forming the copper seed layer using the physical vapor deposition method has problems that an overhang may happen in the via or the trench having a high aspect ratio due to poor layer coverage, and void may be formed within the via or trench in a subsequent copper electroplating process due to discontinuous points of deposition. In order to solve these problems, a research on formation of the copper seed layer using a chemical vapor deposition method has been made. However, this chemical vapor deposition method has disadvantages of poor adhesive force, instability, expensive cost, and the like.

SUMMARY OF THE INVENTION

The present invention is contrived to solve the above problems and an object of the present invention is to provide a method of forming a metal interconnection layer in a semiconductor device by which a dual damascene pattern, a via hole or a trench having a high aspect ratio can be filled with a metal film consecutively without void by means of an electroplating method.

In order to accomplish the above object, the method of forming the metal interconnection layer in the semiconductor device according to the present invention, is characterized in that it comprises the steps of forming a lower conductive layer on a semiconductor substrate, forming an interlayer insulating film on the semiconductor substrate on which the lower conductive layer is formed, selectively etching the interlayer insulating film to form an opening of a given shape through which the lower conductive layer is exposed, forming a metal seed layer along the step on the result in which the opening of the given shape is formed, reflowing the metal seed layer by means of a laser process to form the metal seed layer of an uniform thickness, performing a hydrogen reduction annealing process for the metal seed layer, and forming a metal film on the metal seed layer by means of an electroplating method.

The laser process may be performed using nitrogen or helium as light source of a laser.

It is preferred that the laser process includes illuminating the laser beam at the energy intensity of 1 through 5 mJ/cm$^2$ and application voltage of 1 through 20 KV.

The laser process may include illuminating the laser beam by moving the semiconductor substrate to scan with the light source of the laser being fixed, or by moving the light source of the laser to scan the semiconductor substrate with the semiconductor substrate being fixed.

The laser process may include illuminating the laser beam by reflecting the laser emitted from a laser discharge device using a reflecting mirror and making the focus of the laser beam using a focus control means in order to control the energy intensity.

The laser process may include illuminating the laser beam by positing a slit between a focus control device and the semiconductor substrate and then controlling the intensity of the laser beam emitted from the focus control device.

The metal seed layer may be formed of copper (Cu), nickel (Ni), molybdenum (Mo), platinum (Pt), titanium (Ti) or aluminum (Al).

It is preferred that the metal seed layer is formed in thickness of 50 through 2500 Å.

The hydrogen reduction annealing process is performed using a hydrogen gas, or a hydrogen-mixed gas containing argon (Ar) or nitrogen ($N_2$) of a given concentration at room temperature through 350° C. for 1 minute through 3 hours, in order to make rough the grain size of the metal seed layer and remove a native oxide film formed on the surface of the metal seed layer.

The method may further include the step of forming a diffusion barrier layer on the semiconductor substrate in which the opening is formed before the metal seed layer is formed.

The method further comprises the steps of after the metal film is formed using the electroplating method, performing a hydrogen reduction annealing process for the metal film, and performing a chemical mechanical polishing process for the semiconductor substrate in which the metal film is formed.

The metal film is a copper (Cu) film.

The opening of the given shape is a dual damascene pattern, a via hole or a trench.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
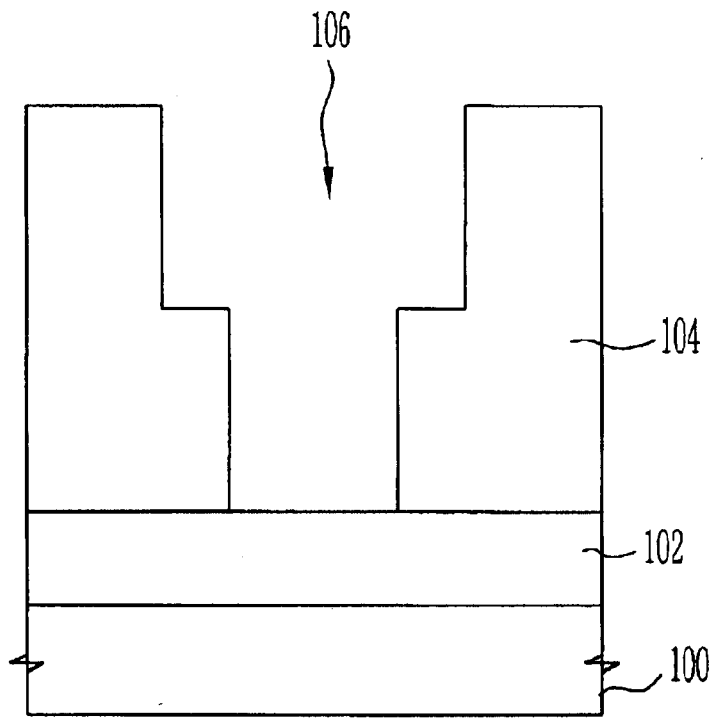
FIG. 1 through FIG. 6 are cross sectional views of semiconductor devices for explaining a method of forming a metal interconnection layer in the semiconductor device according to a preferred embodiment of the present invention.

The present invention will be described in detail by way of a preferred embodiment with reference to accompanying drawings, in which like reference numerals are used to identify the same or similar parts.

FIG. 1 through FIG. 6 are cross sectional views of semiconductor devices for explaining a method of forming a metal interconnection layer in the semiconductor device according to a preferred embodiment of the present invention.

Figure 7:
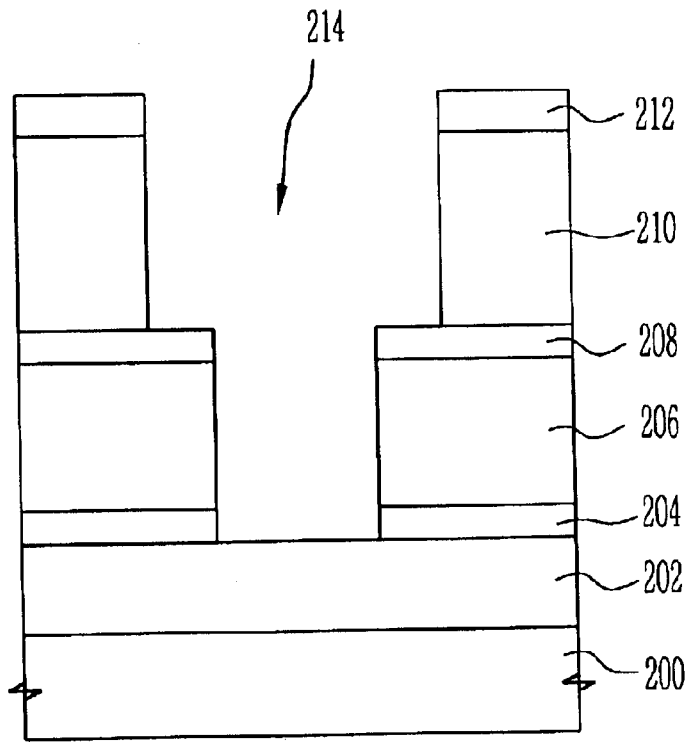
FIG. 7 and FIG. 8 are cross sectional views of semiconductor devices in which dual damascene patterns and via holes are formed that can be each applied to the present invention.
Figure 8:
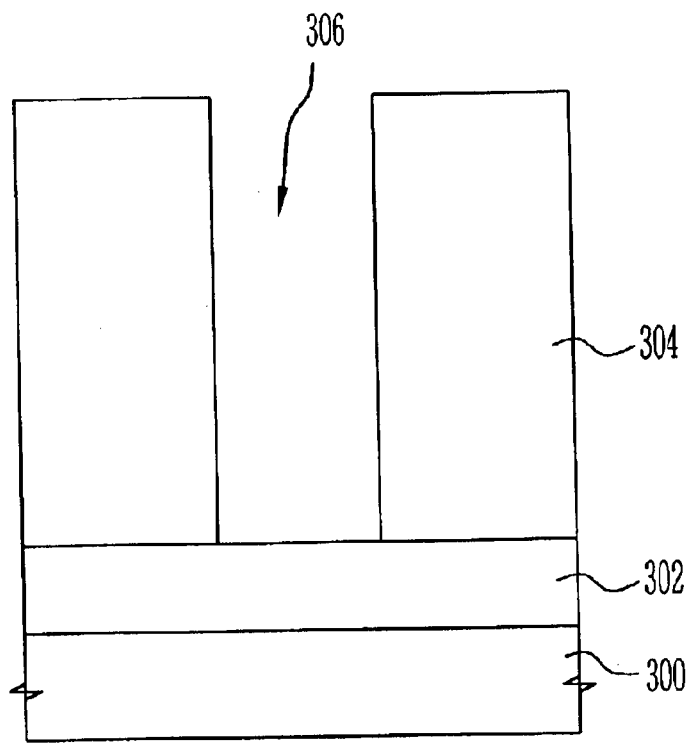

Referring now to FIG. 1, a lower conductive layer 102 is formed on a semiconductor substrate 100 for which several processes for forming a semiconductor device are formed. An interlayer insulating film 104 is then formed. At this time, it is preferred that the interlayer insulating film 104 is formed using an insulating material of a low dielectric constant, for example PSG (phosphorus silicate glass), USG (undoped silicate glass), PE-TEOS (plasma enhanced-tetra ethyl ortho silicate) or HDP (high density plasma) oxide. Next, a dual damascene pattern 106 to be connected to the lower conductive layer 102 is formed in the interlayer insulating film 104. The method of forming the dual damascene pattern 106 has been wide know to ordinary skill in the art. Thus, an explanation on the method will be omitted. Meanwhile, though it was described that the dual damascene pattern 106 is formed in the interlayer insulating film 104 and a subsequent process is then performed, the present invention can be applied to even a method by which an etch stopper 204, a first interlayer insulating film 206 and a second interlayer insulating film 210 are formed on a lower conductive layer 202, a burial hard mask layer 208 is formed between the first interlayer insulating film 206 and the second interlayer insulating film 210, and a dual damascene pattern 214 is then formed in the semiconductor substrate 200 where an upper hard mask layer 212 is formed on the second interlayer insulating film 210, as shown in FIG. 7. Also, the present invention can be applied to even a method by which a via hole or a trench 306 having a high aspect ratio that is connected to a lower conductive layer 302 is formed in an interlayer insulating film 304, as shown in FIG. 8. After the dual damascene pattern 106 is thus formed, the lower conductive layer 102 is exposed. In order to remove a native oxide film or contaminants on the surface of the lower conductive layer 102, a cleaning process is performed. At this time, the cleaning process may use high frequency (RF) plasma process or a reactive cleaning process, depending on the type of the lower conductive layer 102. For example, if the lower conductive layer 102 is made of tungsten (W), aluminum (Al), etc. HF plasma may be used. If the lower conductive layer 102 is made of copper (Cu), the reactive cleaning process may be used.

Figure 2:
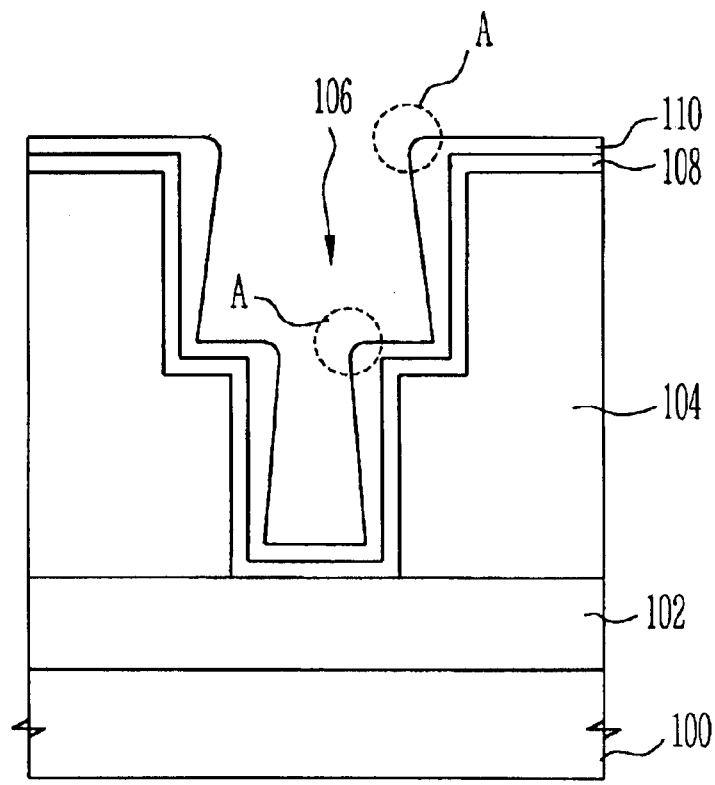

Referring to FIG. 2, a diffusion barrier layer 108 is formed along the step on the semiconductor substrate 100 in which the dual damascene pattern 106 is formed. At this time, it is preferable that the diffusion barrier layer 108 is formed using at least one of a physical vapor deposition (hereinafter called PVD) TiN film, a chemical vapor deposition (hereinafter called CVD) TiN film, a metal organic chemical vapor deposition TiN film, a PVD Ta film, a PVD TaN film, a CVD Ta film, a CVD TaN film, a CVD TaN film, a CVD WN film, a CVD TiAlN film, a CVD TiSiN film and a CVD TaSiN film.

Next, a metal seed layer 110 is formed along the step on the diffusion barrier layer 108. At this time, the metal seed layer 110 may be formed using copper (Cu), nickel (Ni), molybdenum (Mo), platinum (Pt), titanium (Ti), aluminum (Al), or the like by means of PVD, CVD or atomic layer deposition (ALD) method. Also, the metal seed layer 110 is formed in thickness of about 50 Å through 2500 Å. However, if the metal seed layer 110 is deposited, there are problems that an overhang (see 'A' portion in FIG. 2) is formed at the entry portion of deep dual damascene pattern 106 having a high aspect ratio, or discontinuous points of deposition are generated. The overhang formed at the entry portion of the dual damascene pattern 106 having a high aspect ratio or discontinuous points of deposition may degrade a gap fill characteristic in a subsequent electroplating process.

Figure 3:
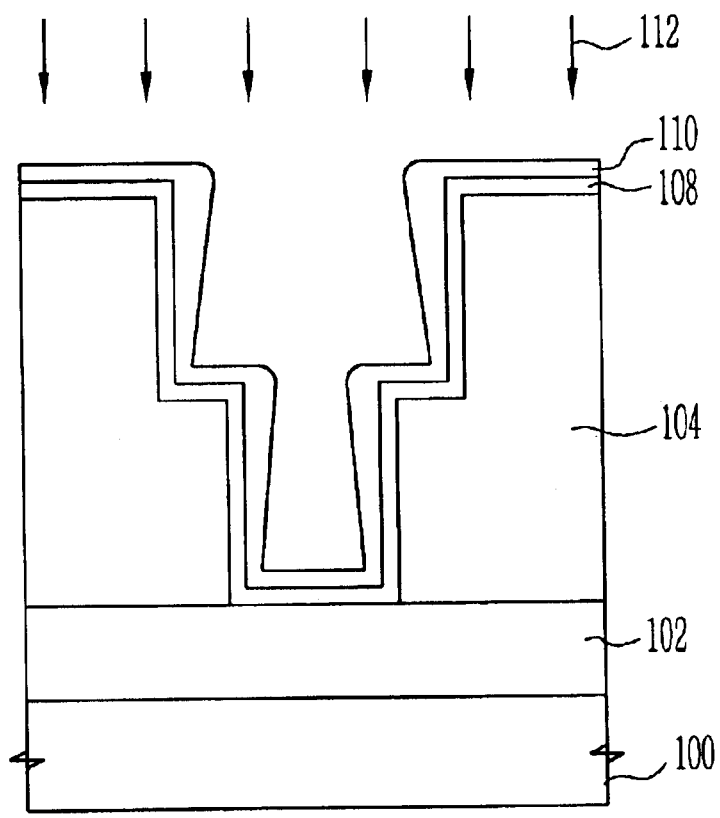

Referring to FIG. 3, in order to remove the overhang formed when the metal seed layer 110 is formed or discontinues points of deposition and to form an metal seed layer 110 of an uniform thickness, a laser process 112 is performed. The laser process 112 means that a laser is illuminated to the metal seed layer 110 to reflow the metal seed layer 110.

The laser used in the present invention may include a KrF or ArF excimer laser of a short wavelength used in an exposure process. However, as the excimer laser has a high-energy intensity and a short wavelength and is illuminated within a narrow region, there is a difficulty in using the excimer laser to reflow the metal seed layer 110. Thus, in order to use this laser of a short wavelength, it is required that the intensity of the energy is reduced and the laser beam is greatly controlled so that the illuminated region can be widen. Also, the laser can be used to anneal the metal seed layer 110 the film quality is relatively weak, by using nitrogen or helium having a wavelength region longer than the excimer layer as the light source. The above methods will be described in more detail.

First, in case of the KrF, ArF excimer having a short wavelength, the intensity energy of the laser beam may be controlled to have about 1 through 5 mJ/cm$^2$ so that the intensity is lower than the existing exposure process. Also, an applied voltage of about 1 kV through 20 kV may be used.

Secondly, after the laser beam emitted from the laser discharge device is reflected, the laser beam may be illuminated to the wafer by making blurred the focus of the focus control device.

Thirdly, the intensity of the laser beam may be lowered by inserting a slit, etc. at the center where the laser focused in the focus control device is illuminated on the surface of the wafer.

Fourthly, illumination using the laser beam is impossible to be illuminated to the entire wafer since the size of the laser beam is very small. The annealing process is performed by illuminating the wafer using the following method. That is, the wafer is moved to scan with the laser fixed, or the laser is moved to scan the wafer with the wafer being fixed.

Fifthly, the laser process may be performed using a laser the intensity of the energy is relatively low by discharging nitrogen or helium, etc. as the light source of the laser. Even in case that nitrogen or helium is used as the light source of the laser, the laser process may be performed using the first through fourth methods.

Figure 4:
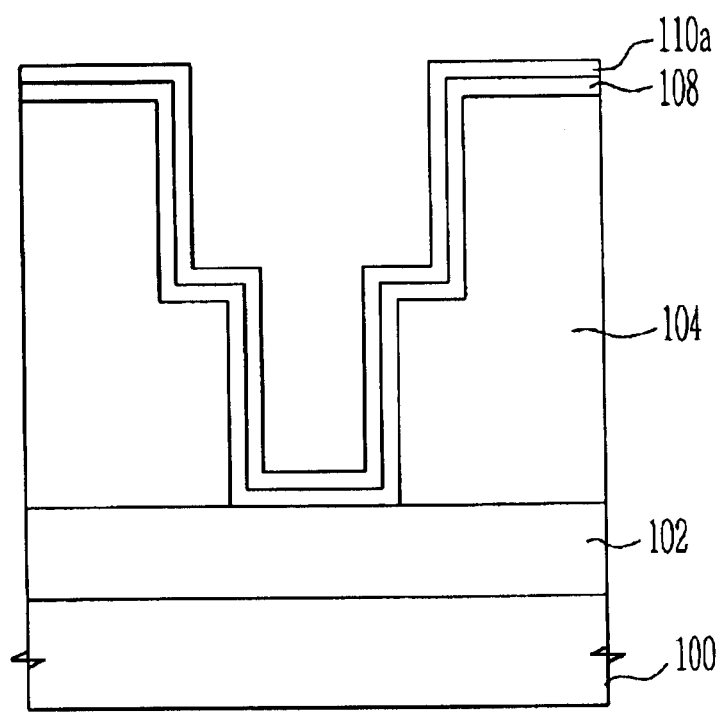

Referring to FIG. 4, the metal seed layer 110 is reflowed by the laser process 112. The overhang formed at the entry portion of the dual damascene pattern 106 or discontinuous points of deposition is removed by the reflow, so that the metal seed layer 110 of an uniform thickness can be obtained. An non-uniform burial that may happen in a subsequent electroplating process can be avoided by forming the uniform metal seed layer 110. The metal film can be filled without forming void.

Meanwhile, the metal may diffuse by a mechanism such as volume diffusion, surface diffusion, evaporation-condensation, viscous flow, etc. The temperature using reflow is usually related to the melting point of the material. If the surface is clean, atoms can freely move on the surface. Thus, a metal such as aluminum (Al) can be reflowed using surface diffusion at a relatively low temperature. However, in case of copper (Cu) having a relatively high melting point, Cu is difficult to diffuse at a low process temperature. However, if the laser process 112 of the present invention is used, Cu can be reflowed at a temperature significantly lower than the melting point of Cu, for example below 400° C. Therefore, the laser process 112 of the present invention can be performed without any anxiety that the interlayer insulating film may be degraded and without problems such as unwanted lateral diffusion of impurities, hot electron effect, etc. in a device of a transistor (not shown) formed in the semiconductor substrate.

Thereafter, in order to make rough the grain size of the metal seed layer 110 and remove the surface oxide layer formed on the surface of the metal seed layer 110, a hydrogen reduction annealing process is performed. At this time, it is preferred that the hydrogen reduction annealing process is performed using a hydrogen gas, or a hydrogen-mixed gas into which argon (Ar) or nitrogen ($N_2$) of a given concentration (below 95%) is contained at room temperature through 350° C. for 1 minute through 3 hours.

Figure 5:
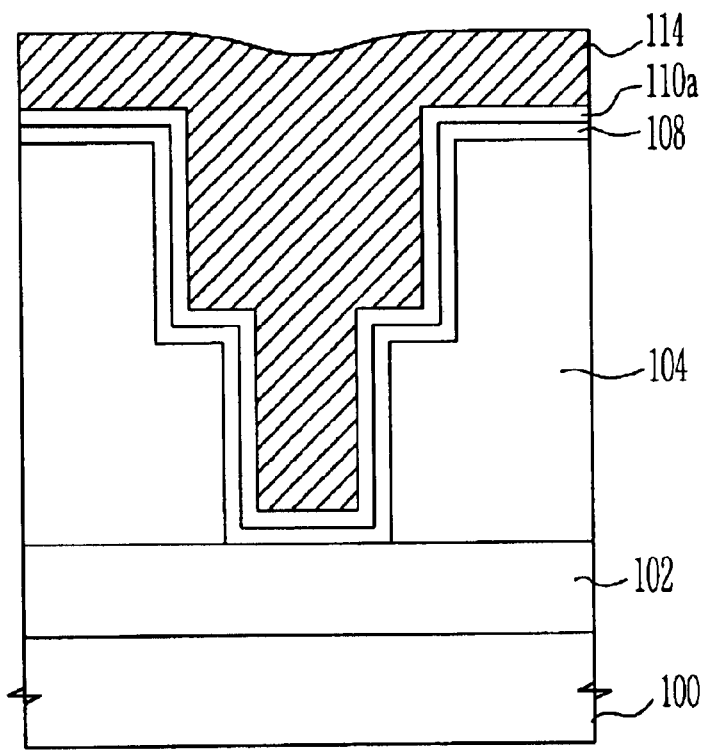

Referring to FIG. 5, a metal film 114 is formed on the metal seed layer 110a having an uniform thickness by means of the electroplating method, thus completely burying the dual damascene pattern 106 with the metal film 114. At this time, it is preferable that the metal film 114 is made of a copper (Cu) film. Next, in order to change the grain morphology of the metal film 114, a hydrogen reduction annealing process is performed. At this time, it is preferred that the hydrogen reduction annealing process is performed using a hydrogen gas, or a hydrogen-mixed gas into which argon (Ar) or nitrogen ($N_2$) of a given concentration (below 95%) is contained at room temperature through 350° C. for 1 minute through 3 hours.

Figure 6:
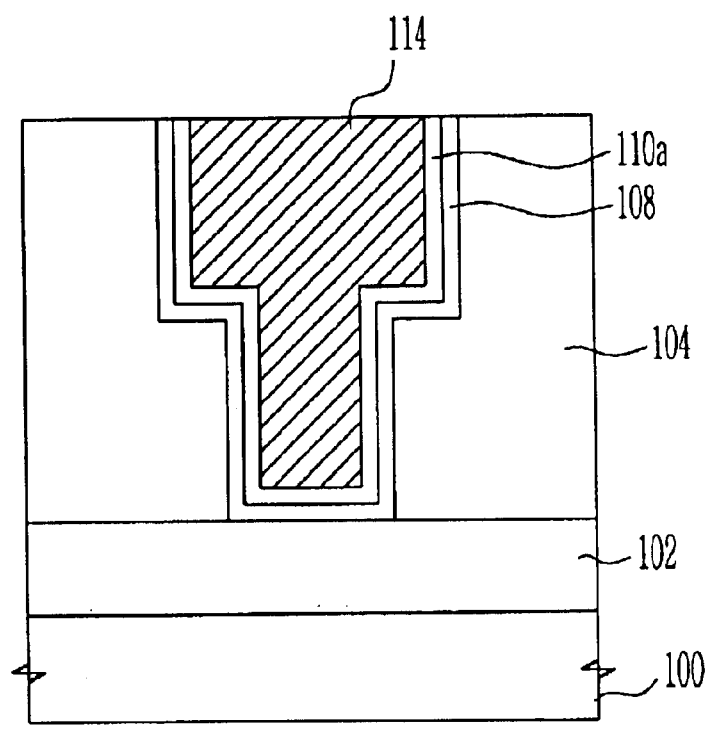

By reference to FIG. 6, the semiconductor substrate 100 in which the metal film 114 is formed by the electroplating method is planarized by means of chemical mechanical polishing. At this time, it is preferred that the chemical mechanical polishing is performed until the interlayer insulating film 104 is exposed.

As mentioned above, according to the present invention, even though the dual damascene pattern, the via hole or the trench for connecting the lower conductive layer and the upper conductive layer has a high aspect ratio, the metal film can be filled without forming void therein. In particular, in forming the copper seed layer using the physical vapor deposition method, there are problems that an overhang is formed in the via hole or the trench having a high aspect ratio due to poor layer coverage, or discontinuous points of deposition is generated to form void within the via hole or the trench in a subsequent copper electroplating process. However, the present invention has an advantageous effect that it can form a copper line filled consecutively without void even though the copper seed layer is formed by means of the physical vapor deposition having poor layer coverage.

Further, according to the present invention, the present invention has an outstanding effect that it can perform an annealing process for a metal seed layer using an laser process without any anxiety of causing degradation of the interlayer insulating film, an unwanted lateral diffusion of impurities in the transistor or a hot electron effect.

It was described that one layer exist on the other layer. However, it should be noted that the one layer may exist right on the other layer and a third layer may be intervened between the one layer and the other layer.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a metal interconnection layer in a semiconductor device, comprising the steps of:

forming a lower conductive layer on a semiconductor substrate;

forming an interlayer insulating film on the semiconductor substrate on which the lower conductive layer is formed;

selectively etching the interlayer insulating film to form an opening of a given shape through which the lower conductive layer is exposed;

forming a metal seed layer along the step on the result in which the opening of the given shape is formed;

reflowing the metal seed layer by means of a laser process to form the metal seed layer of an uniform thickness;

performing a hydrogen reduction annealing process for the metal seed layer; and forming a metal film on the metal seed layer by means of an electroplating method.

2. The method as claimed in claim 1, wherein the laser process is performed using nitrogen or helium as a light source of a laser.

3. The method as claimed in claim 1, wherein the laser process includes illuminating the laser beam at the energy intensity of 1 through 5 mJ/cm$^2$ and application voltage of 1 through 20 KV.

4. The method as claimed in claim 1, wherein the laser process includes illuminating the laser beam by moving the semiconductor substrate to scan with the light source of the laser being fixed, or by moving the light source of the laser to scan the semiconductor substrate with the semiconductor substrate being fixed.

5. The method as claimed in claim 1, wherein the laser process includes illuminating the laser beam by reflecting the laser emitted from a laser discharge device using a reflecting mirror and making the focus of the laser beam using a focus control means in order to control the energy intensity.

6. The method as claimed in claim 1, wherein the laser process includes illuminating the laser beam by positing a slit between a focus control device and the semiconductor substrate and then controlling the intensity of the laser beam emitted from the focus control device.

7. The method as claimed in claim 1, wherein the laser process is performed using an ArF or KrF excimer laser of a short wavelength.

8. The method as claimed in claim 1, wherein the metal seed layer is formed of copper (Cu), nickel (Ni), molybdenum (Mo), platinum (Pt), titanium (Ti) or aluminum (Al).

9. The method as claimed in claim 8, wherein the metal seed layer is formed in thickness of 50 through 2500 Å.

10. The method as claimed in claim 1, wherein the hydrogen reduction annealing process is performed using a hydrogen gas, or a hydrogen-mixed gas containing argon (Ar) or nitrogen ($N_2$) of a given concentration at room temperature through 350° C. for 1 minute through 3 hours, in order to make rough the grain size of the metal seed layer and remove a native oxide film formed on the surface of the metal seed layer.

11. The method as claimed in claim 1, further comprising the step of forming a diffusion barrier layer on the semiconductor substrate in which the opening is formed before the metal seed layer is formed.

12. The method as claimed in claim 1, further comprising the steps of after the metal film is formed using the electroplating method, performing a hydrogen reduction annealing process for the metal film; and performing a chemical mechanical polishing process for the semiconductor substrate in which the metal film is formed.

13. The method as claimed in claim 1, wherein the metal film is a copper (Cu) film.

14. The method as claimed in claim 1, wherein the opening of the given shape is a dual damascene pattern, a via hole or a trench.

* * * * *